(12) United States Patent
Cho et al.

(10) Patent No.: US 7,374,969 B2
(45) Date of Patent: May 20, 2008

(54) SEMICONDUCTOR PACKAGE WITH CONDUCTIVE MOLDING COMPOUND AND MANUFACTURING METHOD THEREOF

(75) Inventors: Byeong-Yeon Cho, Gyeonggi-do (KR); Hee-Seok Lee, Gyeonggi-do (KR); Kyung-Lae Jang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 270 days.

(21) Appl. No.: 11/259,707

(22) Filed: Oct. 25, 2005

(65) Prior Publication Data

US 2006/0097404 A1 May 11, 2006

(30) Foreign Application Priority Data

Nov. 11, 2004 (KR) ........................ 10-2004-0091826

(51) Int. Cl.
*H01L 21/00* (2006.01)
*H01L 23/02* (2006.01)

(52) U.S. Cl. ................. 438/112; 438/121; 257/685; 257/788

(58) Field of Classification Search .............. 438/112, 438/121–127; 257/678, 685, 687, 703, 788, 257/789, 790, 792, 795
See application file for complete search history.

(56) References Cited

U.S. PATENT DOCUMENTS

| | | | | |
|---|---|---|---|---|
| 5,436,203 A | * | 7/1995 | Lin | ............................ 438/126 |
| 6,177,726 B1 | * | 1/2001 | Manteghi | ..................... 257/725 |
| 6,445,060 B1 | * | 9/2002 | Courtenay et al. | .......... 257/666 |
| 6,889,429 B2 | * | 5/2005 | Celaya et al. | ............... 438/126 |
| 7,141,454 B2 | * | 11/2006 | Matayabas et al. | ......... 438/127 |
| 2003/0024723 A1 | | 2/2003 | Igarashi et al. | |

FOREIGN PATENT DOCUMENTS

| | | |
|---|---|---|
| JP | 10-092981 | 4/1998 |
| JP | 2004-172176 | 6/2004 |

OTHER PUBLICATIONS

English language abstract of Japanese Publication No. 10-092981.
English language abstract of Japanese Publication No. 2004-172176.

* cited by examiner

*Primary Examiner*—Kevin M Picardat
(74) *Attorney, Agent, or Firm*—Marger Johnson & McCollom, P.C.

(57) ABSTRACT

The present invention relates to a semiconductor package having a conductive molding compound to prevent static charge accumulation. By using a conductive molding compound heat conductivity is also increased and heat generated by the semiconductor chip is more effectively dissipated externally. Additionally, the conductive compound blocks electromagnetic waves making possible an optimal semiconductor package satisfying the electromagnetic compatibility (EMC) and increasing the reliability of the semiconductor chip especially when processing high-speed signals.

39 Claims, 7 Drawing Sheets

SEMICONDUCTOR PACKAGE WITH CONDUCTIVE MOLDING COMPOUND AND MANUFACTURING METHOD THEREOF

CROSS REFERENCE TO RELATED APPLICATIONS

This U.S. non-provisional application claims benefit of priority under 35 U.S.C. §119 of Korean Patent Application No. 2004-91826, filed on Nov. 11, 2004, the entire contents of which are incorporated herein by reference.

BACKGROUND OF THE INVENTION

1. Field of the Invention

The present invention relates to a semiconductor package and, more particularly, to a semiconductor package having a sealant or molding compound including conductive material, and a manufacturing method thereof.

2. Description of the Related Art

A recent trend in the electronic industry is to manufacture reliable, light, compact, high-speed, multifunctional, and high-performance electronic products at low costs. The package assembly technology enables manufacture of such electronic products. One of the typical packages developed recently is a ball grid array (BGA) package.

Compared to a conventional plastic package, the BGA package requires a minimum mounting area of a motherboard and has improved electrical characteristics. Unlike the conventional plastic package, the BGA package uses a printed circuit board instead of a lead frame. The printed circuit board has an advantage of higher mounting density on, for example, a mother board because contact points, e.g., solder balls, can be formed on an entire undersurface of the printed circuit board, e.g., on the surface of the printed circuit board opposite that surface mounting the semiconductor chip.

FIG. 1 is a cross-sectional view of a conventional BGA package 100. The semiconductor package 100 includes a semiconductor chip 110, a substrate 120, bonding wires 140, a sealant 160, and solder balls 150.

The substrate 120 includes an insulating substrate 121, substrate pads 122 formed on the insulating substrate 121 and electrically connecting the substrate 120 to the semiconductor chip 110, ball pads 123 formed at the bottom of the insulating substrate 121 for electrical connection to an external device (not shown), a substrate-insulating layer 124 formed at the bottom of the insulating substrate 121 and exposing the ball pads 123, and an under bump metallization (UBM) layer 125 formed on the ball pad 123 to improve the adhesive strength between the solder balls 150 and the ball pads 123. The semiconductor chip 110 is bonded with an upper surface of the substrate 120 via a chip-adhesion layer 130.

The semiconductor chip 110 includes chip pads 112 on a chip substrate 111, and a passivation layer 113 formed on the chip substrate 111 and exposing the chip pads 112.

Each of the bonding wires 140 electrically connects one of the substrate pads 122 of the substrate 120 to one of the chip pads 112 of the semiconductor chip 110. In general, the bonding wires 140 are formed of gold (Au).

The sealant 160 is formed of epoxy resin, and seals a part of the upper surface of the substrate 120, the semiconductor chip 110, and the bonding wires 140. The sealant 160 protects the semiconductor chip 110 and the bonding wires 140 from a mechanical or electrical shock.

The solder balls 150 are formed on the UBM layer 125 at the bottom of the substrate 120, and act as external terminals of the semiconductor package 100.

Such a conventional semiconductor package has the certain disadvantages, including the following. First, the conventional semiconductor package may be damaged by an electrical shock caused by polarization. FIG. 2 is a conceptual diagram illustrating the polarization that occurs in the sealant 160 of the conventional semiconductor package 100 of FIG. 1. Since the sealant 160 is formed of epoxy, an insulating material, electric current is not discharged to the outside. Thus, negative charges E2 are concentrated in one side as shown in FIG. 2, thereby causing an uneven distribution of charges in the sealant 160. In FIG. 2, E1 denotes positive charges. The polarization causes static electricity to occur. An integrated circuit of the semiconductor chip 110 may be damaged by an electrical shock caused by such static electricity.

Second, the sealant 160, typically epoxy, has poor heat conductivity. Heat generated from the semiconductor chip 110, as sealed within sealant 160, is not completely dissipated to the outside. When the semiconductor chip 110 operates at a high temperature for a given time, the integrated circuit of the semiconductor chip 110 may malfunction.

Third, as the semiconductor chip 110 operating speed increases, electromagnetic interference (EMI) in the semiconductor chip 110, or from the outside of the semiconductor chip 110, may cause a critical problem. However, it is difficult to effectively block an electromagnetic wave causing the EMI because the sealant 160 of the conventional semiconductor package 100 is formed of insulating resin, e.g., epoxy. Accordingly, optimum design of a semiconductor package, e.g., able to satisfy the electromagnetic compatibility (EMC) on a system level, may not be achievable.

SUMMARY OF THE INVENTION

Embodiments of the present invention provide a semiconductor package sealant electrically conductive to prevent of polarization, improve heat dissipation, and block electromagnetic waves. Embodiments of the present invention also provide a manufacturing method therefor.

A method of manufacturing a semiconductor package in accordance with an embodiment of the present invention comprises the steps of (A) fabricating a substrate by forming an insulating substrate, forming substrate pads on the insulating substrate, and electrically connecting ball pads to the substrate pads; (B) forming through holes by piercing the substrate, and filling the through holes with conductive lines made of a first conductive material; (C) attaching a semiconductor chip on the substrate, and electrically connecting chip pads on the semiconductor chip to the substrate pads by connecting means; (D) forming an insulation coating layer on the chip pads, the substrate pads, and the connecting means; (E) sealing the semiconductor chip, the connecting means, and the conductive lines with a conductive molding compound containing a second conductive material to electrically connect one end of the conductive line to the conductive molding compound; and (F) forming solder balls on the ball pads and the other end of the conductive line for external electrical connection thereto.

According to a preferred embodiment of the present invention, laser beam machining forms the through holes.

According to another preferred embodiment of the present invention, the first conductive material may include copper (Cu) or aluminum (Al).

According to another preferred embodiment of the present invention, the connecting means may be bonding wires formed of gold.

According to another preferred embodiment of the present invention, after the step (B) or (C), a protection tape may be attached at the end of the conductive lines, facing towards the semiconductor chip, and the protection tape is removed after the step (D).

According to another preferred embodiment of the present invention, the insulation-coating layer may be a PI coating layer formed of polyimide.

According to another preferred embodiment of the present invention, the step (D) includes a step of covering the chip pads, the substrate pads, and the connecting means with the insulation-coating layer by spraying a solution of insulation coating material thereon.

According to another preferred embodiment of the present invention, the step (D) further includes a step of coating the chip pads, the substrate pads, and the connecting means by a wetting method in which the chip pads, the substrate pads, and the connecting means are immersed in a B-stage solution, which is an intermediate stage of hardening the insulation coating material.

According to another preferred embodiment of the present invention, the second conductive material may include at least one of copper (Cu), gold (Au), silver (Ag), aluminum (Al), nickel (Ni), and chromium (Cr).

Another embodiment of the present invention provides a semiconductor package including: a substrate having an insulating substrate, substrate pads formed on the insulating substrate, and ball pads electrically connected to the substrate pads; a semiconductor chip attached to the substrate and having chip pads; connecting means electrically connecting the substrate pads to the chip pads; a sealant sealing the semiconductor chip and the connecting means; and solder balls formed on the ball pads. The chip pads, substrate pads, and connecting means are coated with an insulation coating material, and the sealant is a conductive molding compound containing a third conductive material. The conductive molding compound is electrically connected to the solder balls via conductive lines formed of a fourth conductive material.

According to another preferred embodiment of the present invention, the connecting means may include bonding wires made of gold (Au).

According to another preferred embodiment of the present invention, the insulation-coating layer may be a PI coating layer formed of polyimide.

According to another preferred embodiment of the present invention, the third conductive material may include at least one of copper (Cu), gold (Au), silver (Ag), aluminum (Al), nickel (Ni), and chromium (Cr).

According to another preferred embodiment of the present invention, the fourth conductive material may be copper or aluminum.

According to another preferred embodiment of the present invention, piercing the substrate may form the conductive lines.

According to another preferred embodiment of the present invention, the ends of the conductive line facing towards the semiconductor chip may be electrically connected to the sealant.

According to another preferred embodiment of the present invention, the solder balls may be formed at the other ends of the conductive lines for external connection.

DETAILED DESCRIPTION

A method of manufacturing a semiconductor package according to an embodiment of the present invention will now be described in greater detail with reference to the accompanying drawings.

FIGS. 3A to 3K are cross-sectional views illustrating a method of manufacturing a semiconductor package according to embodiments of the present invention.

Figure 3A:
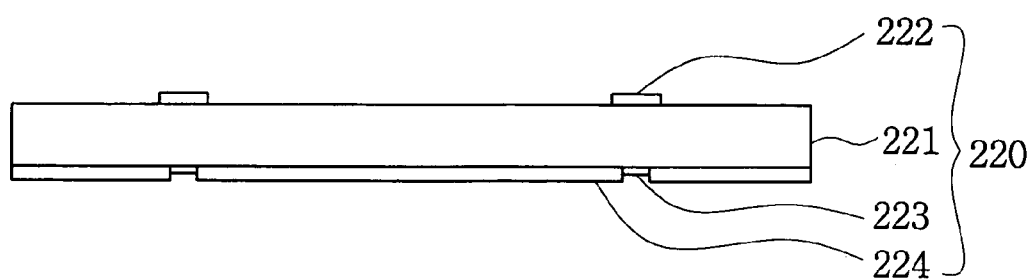
FIGS. 3A through 3K are cross-sectional views explaining a structure and method of manufacturing a semiconductor package according to embodiments of the present invention.

As shown in FIG. 3A, a substrate 220 is provided with an insulating substrate 221, substrate pads 222, and ball pads 223. The ball pads 223 are electrically connected to the substrate pads 222 and exposed through a substrate-insulating layer 224. Circuit patterns are formed on the upper and lower surfaces of the insulating substrate 221 for the electrical connections to the substrate pads 222 and the ball pads 223 respectively, and metal lines are formed for the electrical connection of the substrate pads 222 to the ball pads 223. The circuit patterns and metal lines are omitted in the drawings for simplification.

Figure 3B:
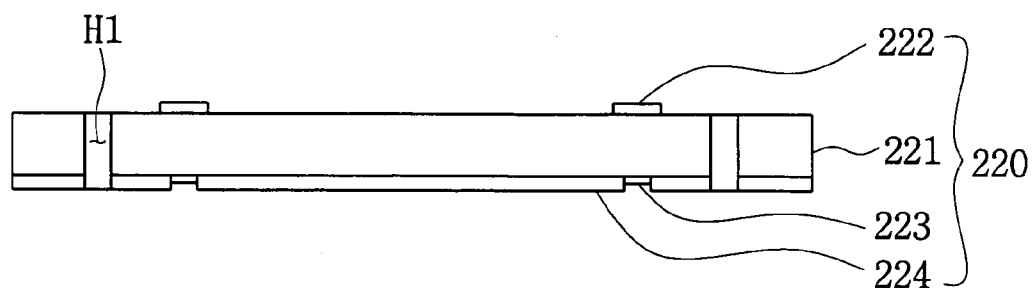

As shown in FIG. 3B, piercing the substrate 220 forms through holes H1. For example, an excimer laser, e.g., Nd—YAG laser, may be used to form a plurality of through holes H1. Alternatively, the through holes H1 may be formed mechanically such as by as drilling. The larger the diameter of the through hole H1, the greater the diameter of a conductive line V, which will be described later with reference to FIG. 3C, and the better its electric conductivity. However, an excess diameter of the through holes H1 can structurally affect substrate 220, e.g., make it more likely to bend. Accordingly, the size, e.g., diameter, of the through holes H1 is preferably less than or equal to the size, e.g., diameter, of the substrate pads 222.

Figure 3C:
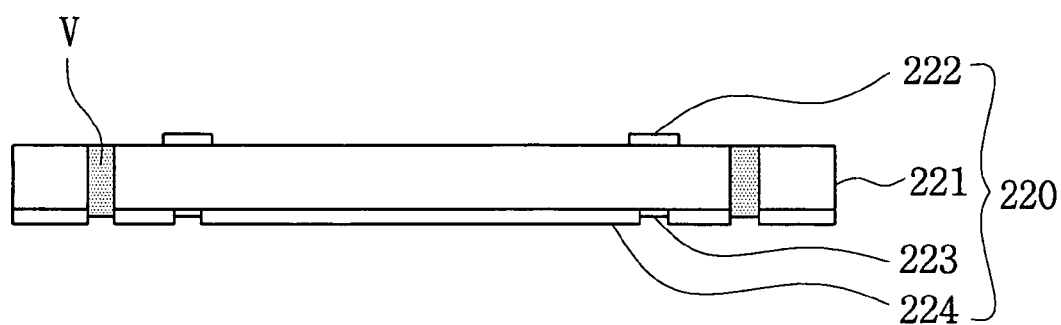

As shown in FIG. 3C, each through hole H1 is filled with a conductive line V formed of copper (Cu) or aluminum (Al). In this embodiment, conductive lines V fill the through holes H1. However, the conductive line V may be formed in the shape of a cylindrical pipe along the inner sidewalls of the through holes H1. An under bump metallization (UBM) layer 225 (FIG. 3D) formed at the bottom of the conductive line V is preferably formed to be flush with the remainder of UBM layer 225 of FIG. 3D and is formed on the ball pads 223. A solder ball 250 (FIG. 3K) formed at the bottom of the conductive line V is preferably formed level with the other solder balls 250 formed on the ball pads 223. As will be appreciated, locating solder balls 250 in coplanar relation simplifies a subsequent process. Further, by making flush the solder balls 250, it is possible to prevent the tilting of the package or prevent a bad electrical connection between terminals when the package is mounted, e.g., on a planar motherboard. Accordingly, the through hole H1 of FIG. 3B is preferably filled with the conductive line V such that the lower surface of the conductive line V is formed level with the lower surface of the ball pad 223.

Figure 3D:
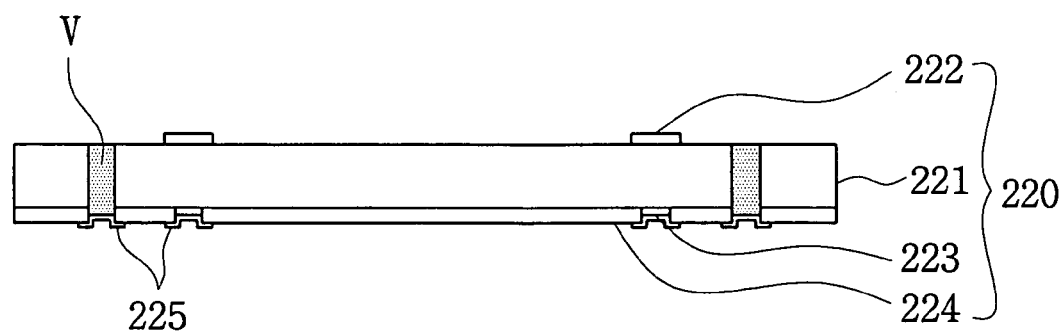

As shown in FIG. 3D, the UBM layer 225 is formed at the lower surfaces of the ball pads 223 and the conductive lines V. The UBM layer 225 improves the adhesive strength of the solder balls 250 (FIG. 3K) and prevents diffusion of unnecessary substances of the solder ball 250 to the substrate 220. The UBM layer 225 may be formed in a subsequent process, but typically before forming the solder balls 250.

Figure 3E:
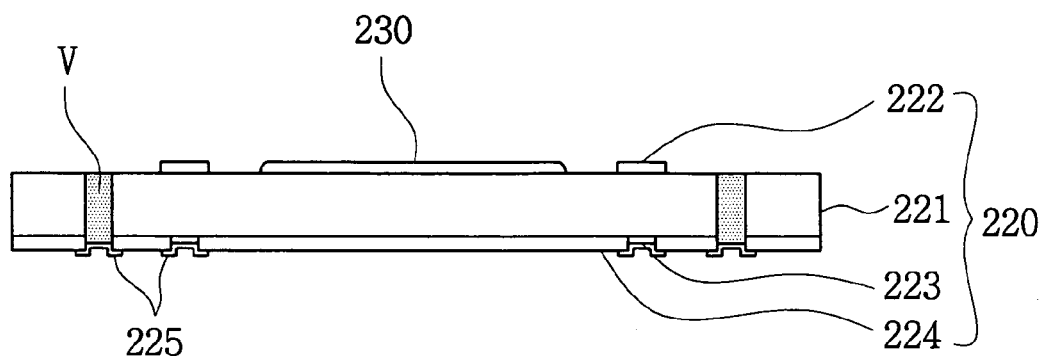

As shown in FIG. 3E, a chip-adhesion layer 230 is formed on the substrate 220. The chip-adhesion layer 230 bonds a semiconductor chip 210, which will be described later with reference to FIG. 3F, to the substrate 220.

Figure 3F:
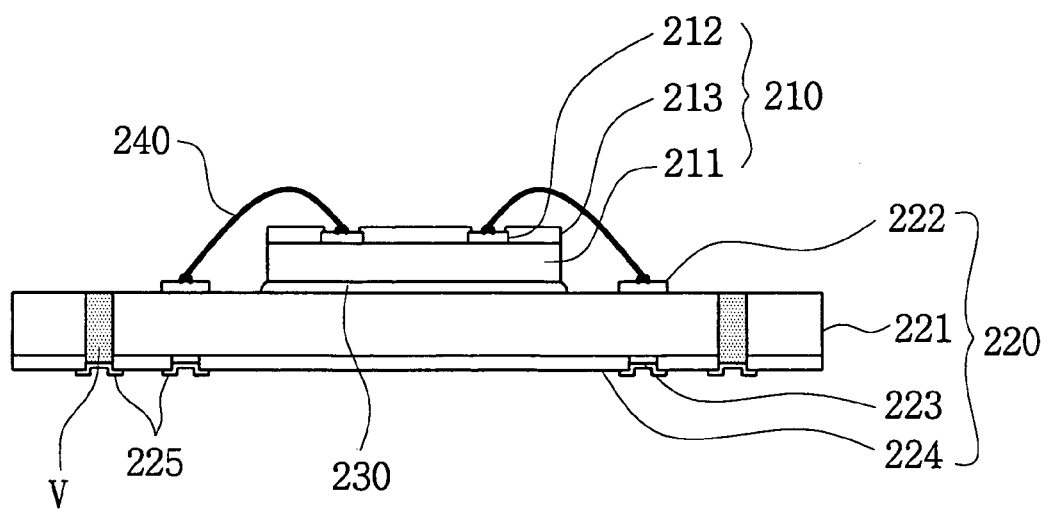

As shown in FIG. 3F, the semiconductor chip 210 is mounted on the chip-adhesion layer 230 of the substrate 220. Chip pads 212 of a semiconductor chip 210 electrically connect to the substrate pads 222 via bonding wires 240. A passivation layer 213 is formed on the semiconductor chip 210, but the chip pads 212 on a chip substrate 211 are exposed through the passivation layer 213. The bonding wires 240 are typically formed of gold (Au). Conventional plasma cleaning is preferably performed on the bonding wires 240 prior to wire bonding to increase the adhesive strength of the bonding wires 240.

Figure 3G:
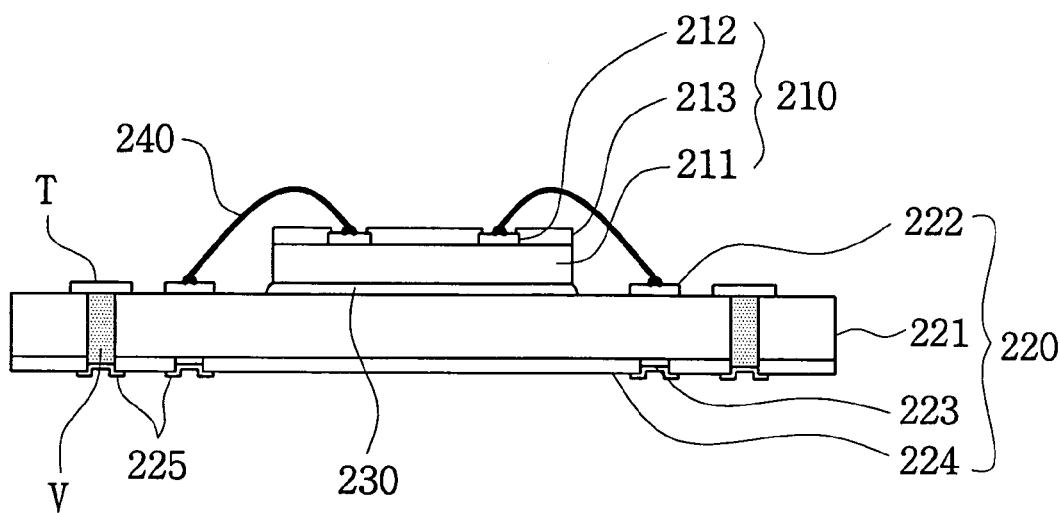
Figure 3H:
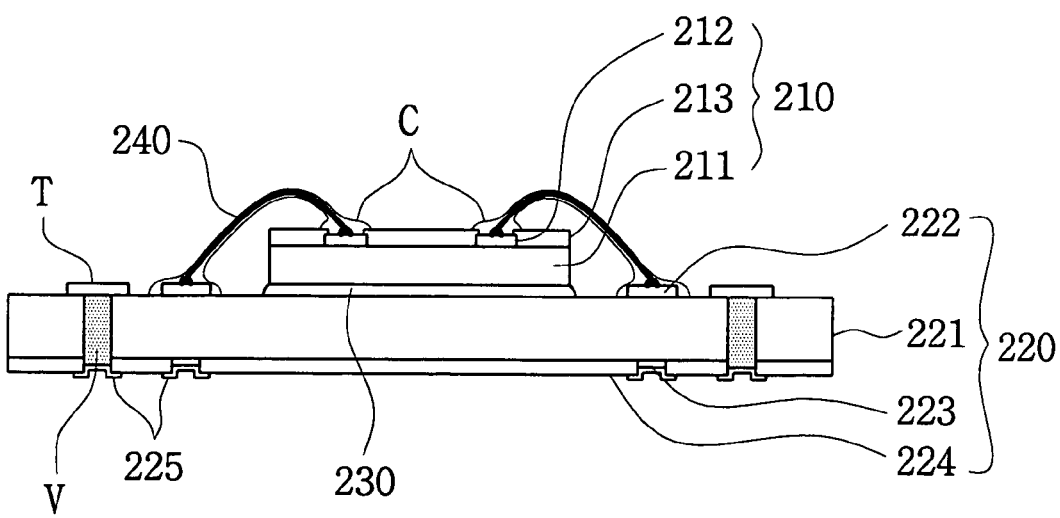

As shown in FIG. 3G, a protection tape T is attached onto the upper surface of the conductive line V. The protection tape T prevents contamination of the upper surface of the conductive line V when forming a PI coating layer C (FIG. 3H). Alternatively, the protection tape T may be attached in a subsequent process, but typically before forming the PI coating layer C.

As shown in FIG. 3H, the PI coating layer C is formed by coating the chip pads 212, substrate pads 222, and bonding wires 240 with an insulating material, such as polyimide. Alternatively, the PI coating layer C may be formed by a method of spraying a polyimide solution, or by a wetting method in which the chip pads 212, substrate pads 222, and bonding wires 240 are immersed in a polyimide solution in B-stage, e.g., an intermediate step of hardening a polyimide. The spray method is recommended in forming the PI coating layer C to coat predetermined regions selectively and quickly. It is also desirable to heat the semiconductor package in a high temperature oven to quickly harden the polyimide solution.

Figure 3I:
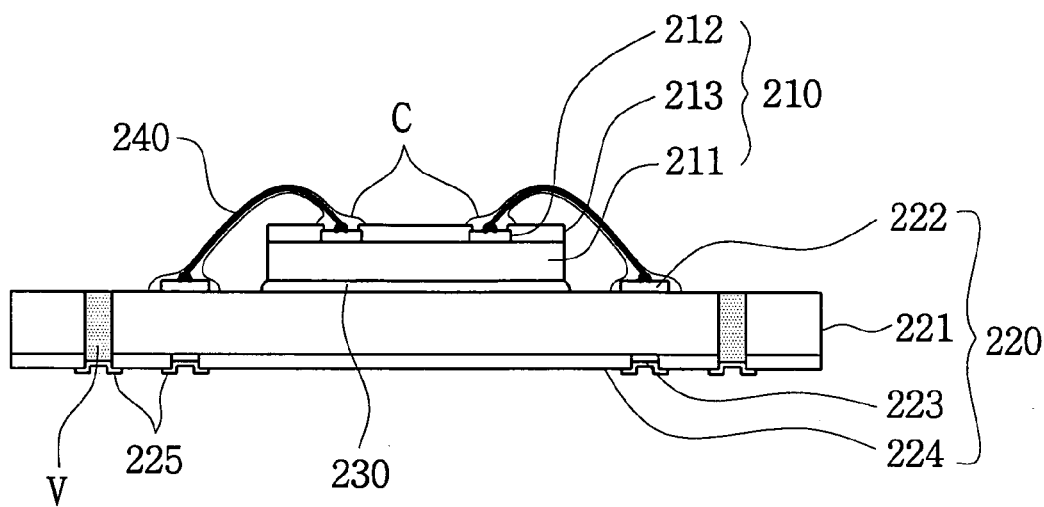

As shown in FIG. 3I, the protection tape T of FIG. 3G is removed from the substrate 220. The protection tape T may be removed in a subsequent process, but typically before applying conductive molding compound 260, which will be later described with reference to FIG. 3J.

After removing the protection tape T, it is preferable to clean the surface of constituent units of the semiconductor package by the plasma cleaning to increase the adhesive strength between the conductive molding compound 260 and the constituent units.

Figure 3J:
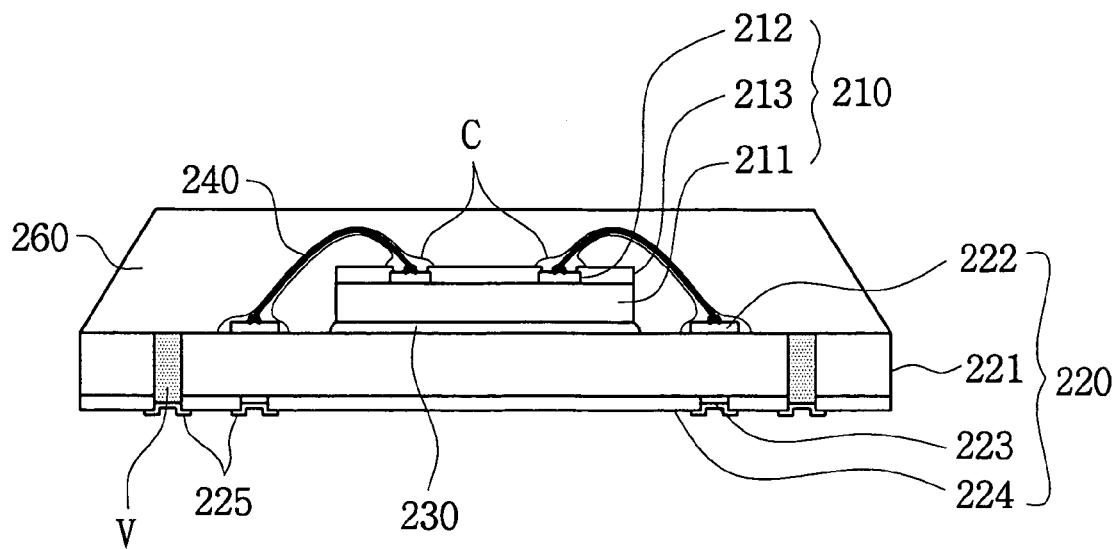

As shown in FIG. 3J, the semiconductor chip 210, bonding wires 240, exposed upper ends of the conductive lines V, and a part of the upper surface of the substrate 220 are sealed by the conductive molding compound 260, which contains a conductive material, thereby electrically connecting the conductive line V to the conductive molding compound 260. The conductive material is electrically conductive by including at least one of copper (Cu), gold (Au), silver (Ag), aluminum (Al), nickel (Ni), and chrome (Cr).

Solder balls 250, on the UBM layers 225 at the bottoms of the conductive lines V and the ball pads 223 in the substrate 220, may be used as external terminals to complete manufacture of a semiconductor package according to an embodiment of the present invention.

A structure of a semiconductor package according to another embodiment of the present invention will now be described in more detail.

Figure 3K:
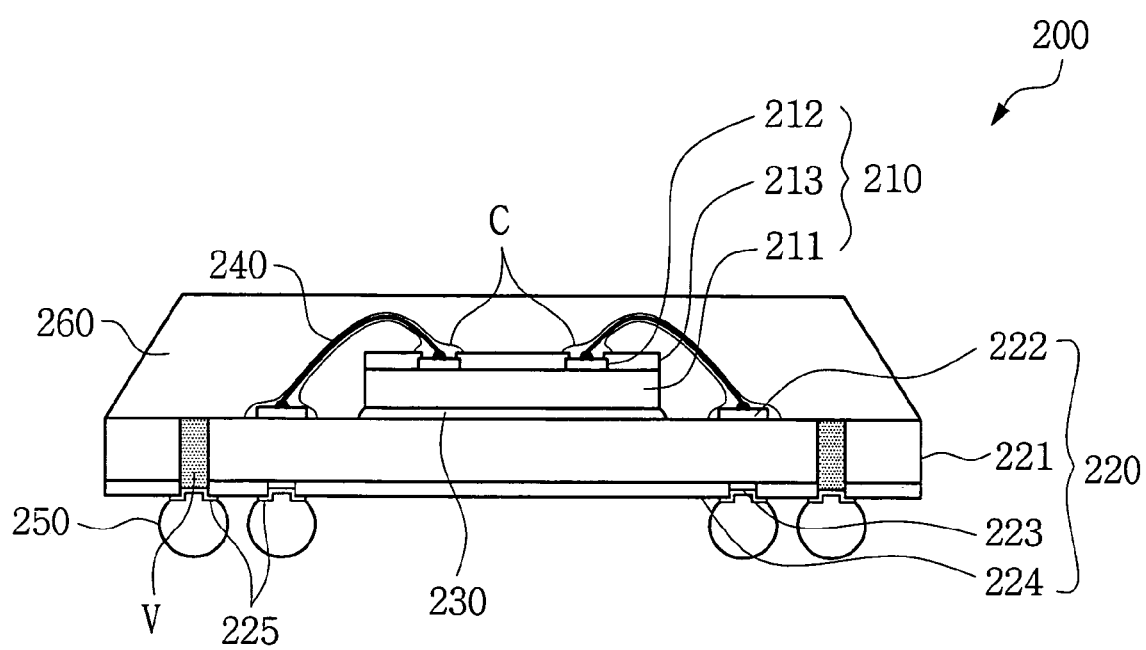

As shown in FIG. 3K, the semiconductor package 200 includes a semiconductor chip 210, a substrate 220, bonding wires 240, a PI coating layer C, conductive molding compound 260, conductive lines V, and solder balls 250.

The substrate 220 includes an insulating substrate 221, substrate pads 222 formed on the insulating substrate 221 for electrical connection to the semiconductor chip 210, ball pads 223 formed at the bottom of the insulating substrate 221 for electrical connection to an external device, a substrate-insulating layer 224 formed at the bottom of the insulating substrate 221 exposing the ball pads 223, and a UBM layer 225 formed on the ball pads 223 and the bottom of the conductive lines V to improve the adhesive strength between the solder ball 250 and the ball pad 223. The semiconductor chip 210 is attached to the upper surface of the substrate 220 through a chip-adhesion layer 230.

The semiconductor chip 210 includes chip pads 212 formed on a chip substrate 211, and a passivation layer 213 formed on the chip substrate 211 exposing the chip pads 212.

The bonding wires 240 electrically connect the substrate pads 222 on the substrate 220 to the chip pads 212 on the semiconductor chip 210. The bonding wires 240 are formed of gold (Au).

The chip pads 212, substrate pads 222, and bonding wires 240 are covered with a PI coating layer C formed of polyimide as an insulating material. Thus, the chip pads 212, substrate pads 222, and bonding wires 240 are electrically insulated from the conductive molding compound 260 by the PI coating layer C.

A part of the upper surface of the substrate 220, the semiconductor chip 210, the bonding wires 240, and the exposed upper surfaces of the conductive lines V are sealed by the conductive molding compound 260, which protects the semiconductor chip 210 and the bonding wires 240 from a mechanical or electrical shock. The conductive molding compound 260 is electrically conductive, since it is formed of molding resin including a conductive material. The conductive material may include at least one of copper (Cu), gold (Au), silver (Ag), aluminum (Al), nickel (Ni), and chrome (Cr). The conductive molding compound 260 is electrically connected to the conductive lines V, and thus acts as a ground electrode when the solder balls 250 on the conductive lines V are connected to an external ground.

Figure 1:
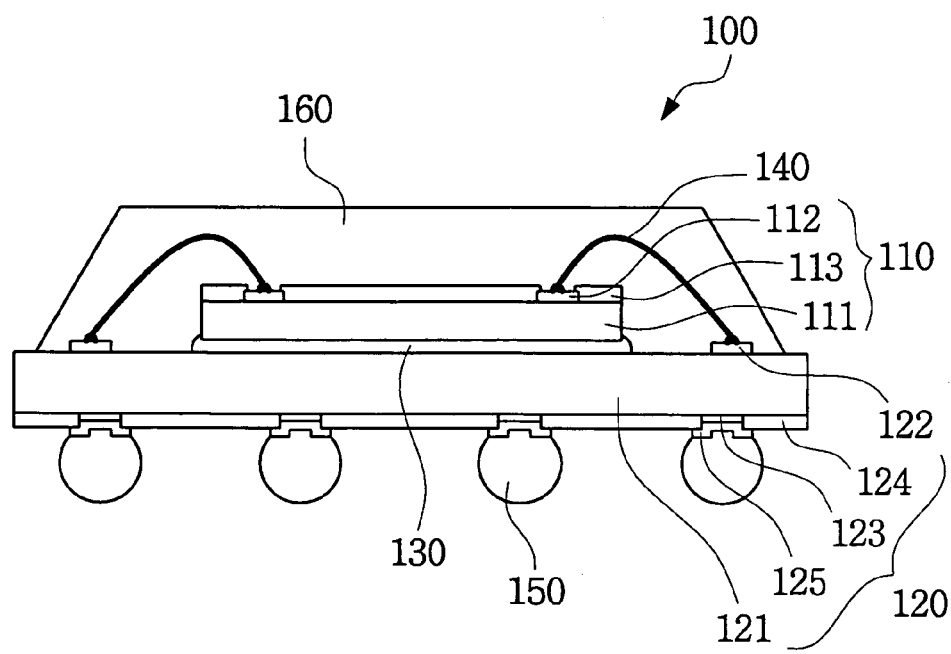
FIG. 1 is a cross-sectional view of a conventional ball grid array (BGA) semiconductor package.
Figure 2:
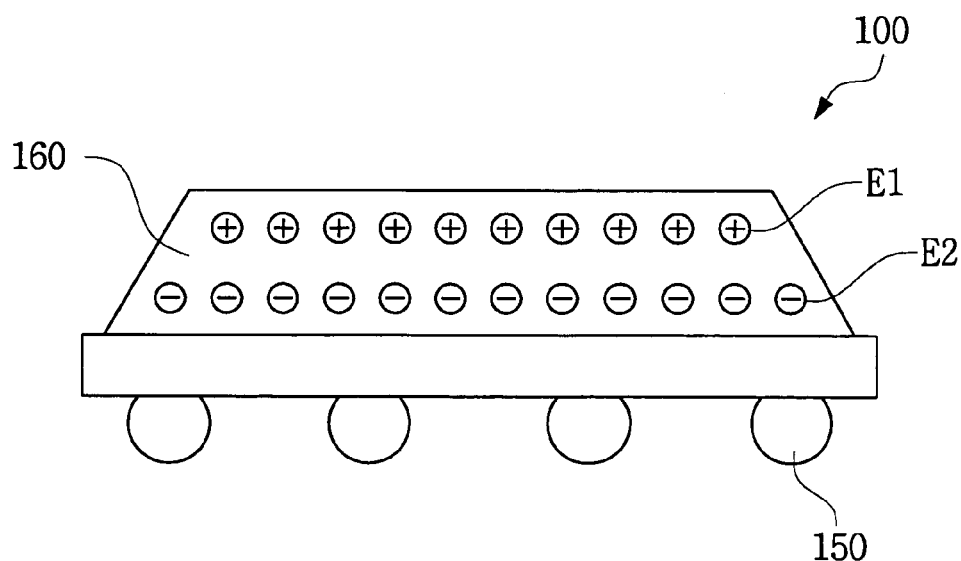
FIG. 2 is a conceptual diagram briefly illustrating polarization in a sealant of the conventional semiconductor package of FIG. 1.

Using the conductive molding compound 260 having electric conductivity improves heat conductivity without the polarization of charges occurring in the conventional sealant 160 as shown in FIG. 2, therefore heat generated from the semiconductor chip 210 can be easily dissipated to the outside. As described above, when the conductive molding compound 260 acts as a ground electrode, it is possible to prevent an integrated circuit of the semiconductor chip 210 from damage by an external electric shock, and to effectively block an electromagnetic wave generated from the semiconductor chip 210 or from an external source.

The solder balls 250 are formed on the UBM layer 225 on the ball pads 223 and on the lower surfaces of conductive lines V, and act as external terminals of the semiconductor package 200.

As described above, a semiconductor package according to some embodiments of the present invention uses a conductive molding compound electrically connected to an external ground, thereby has advantages of preventing the polarization of charges occurring in a conventional sealant, and protecting an integrated circuit of a semiconductor chip from an external electric shock.

By using the conductive molding compound with an improved electrical conductivity, heat conductivity is also increased. Accordingly, heat generated from the semiconductor chip is easily dissipated to outside the package. Accordingly, it is possible to prevent malfunction of the semiconductor chip due to prolonged high temperature.

When the conductive molding compound acts as a ground electrode, the conductive molding compound can effectively block an electromagnetic wave generated from the semiconductor chip, or from the outside. Therefore, it is possible to design an optimal semiconductor package satisfying the electromagnetic compatibility (EMC) and thereby increase the reliability of the semiconductor chip especially when processing high speed signals.

Further, the semiconductor package has strong resistance to an external shock, by protecting bonding wires with a PI coating layer. Therefore, it is possible to prevent wire sweeping and short circuits between adjacent wires caused by a flow of resin, such as conductive molding compound, in a molding process, and a more stable molding process can be performed.

Although this invention has been particularly shown and described with reference to example embodiments thereof, it will be understood by those skilled in the art that various changes in form and details may be made therein without departing from the spirit and scope of the invention as defined by the appended claims.

What is claimed is:

1. A method of manufacturing a semiconductor package, comprising the steps of:
   (A) providing a substrate having an insulating substrate, substrate pads on the insulating substrate, and ball pads electrically connected to the substrate pads;
   (B) forming through holes by piercing the substrate and filling the through holes with conductive lines formed of a first conductive material;
   (C) mounting a semiconductor chip on the substrate, and electrically connecting chip pads on the semiconductor chip to the substrate pads via connecting means;
   (D) applying an insulation coating layer onto the chip pads, the substrate pads, and the connecting means by spraying an insulation coating solution thereon;
   (E) sealing the semiconductor chip, the connecting means, and the conductive lines with a conductive molding compound containing a second conductive material to electrically connect a first end of each conductive line to the conductive molding compound; and
   (F) forming solder balls on the ball pads and a second end of each conductive line for external electrical connections.

2. The method of claim 1, wherein the through holes are formed by laser beam machining.

3. The method of claim 1, wherein the first conductive material includes at least one of copper (Cu) and aluminum (Al).

4. The method of claim 1, wherein the connecting means are bonding wires formed of gold.

5. The method of claim 1, wherein after at least one of forming through holes and mounting a semiconductor chip, a protection tape is attached to seal one end of each conductive line, facing towards the semiconductor chip, and wherein the protection tape is removed after applying an insulation coating layer.

6. The method of claim 5, wherein the insulation coating layer includes a PI coating layer formed of polyimide.

7. The method of claim 1, wherein the insulation coating layer includes a PT coating layer formed of polyimide.

8. The method of claim 1, wherein the second conductive material includes at least one of copper (Cu), gold (Au), silver (Ag), aluminum (Al), nickel (Ni), and chromium (Cr).

9. A semiconductor package comprising:
   a substrate having an insulating substrate, substrate pads formed on an upper surface of the insulating substrate, ball pads disposed on a lower surface of the insulating substrate and electrically connected to the substrate pads, and an under-bump metallization (UBM) disposed on the ball pads;
   a semiconductor chip having chip pads, attached to the substrate;
   connecting means electrically connecting the substrate pads to the chip pads;
   a sealant adapted to seal the semiconductor chip and the connecting means, the sealant contacting sides of the semiconductor chip; and
   conductive balls formed on the UBM of the ball pads, the conductive balls comprising first conductive balls and second conductive balls,
   wherein the chip pads, the substrate pads, and the connecting means are coated with an insulation coating layer, the sealant is a conductive molding compound containing a first conductive material, the conductive molding compound is electrically connected to the first conductive balls via conductive lines formed of a second conductive material, and the second conductive balls are electrically connected to the substrate pads.

10. The package of claim 9, wherein the connecting means are bonding wires formed of gold (Au).

11. The package of claim 9, wherein the insulation coating layer is a PI coating layer formed of polyimide.

12. The package of claim 9, wherein the first conductive material includes at least one of copper (Cu). gold (Au), silver (Ag), aluminum (Al), nickel (Ni), and chromium (Cr).

13. The package of claim 9, wherein the second conductive material includes at least one of copper (Cu) and aluminum (Al).

14. The package of claim 13, wherein the conductive lines are formed by piercing the substrate.

15. The package of claim 14, wherein a first end of each conductive line facing toward the semiconductor chip is electrically connected to the sealant.

16. The package of claim 15, wherein the conductive balls are formed on a second end of each conductive line to provide an external electrical connection.

17. The package of claim 9, wherein the conductive lines are formed by piercing the substrate.

18. An integrated circuit package comprising:
    an integrated circuit;
    a circuit substrate, the integrated circuit having a first surface portion attached to a first surface of the circuit substrate, the circuit substrate having at least one conductive path coupling the first surface thereof and a second surface thereof;
    a plurality of bonding wires electrically connecting the integrated circuit to the circuit substrate;
    a plurality of coating layers respectively coating each of the plurality of bonding wires and pad elements on the intetrated circuit to which the bonding wires are connected; and
    a conductive sealant enclosing remaining portions of the integrated circuit and portions of the first surface of the circuit substrate surrounding the integrated circuit, the conductive sealant being electrically coupled to the conductive path.

19. An integrated circuit package according to claim 18, wherein the at least one conductive path comprises a single through hole coupling the first and second sides of the circuit substrate.

20. The package according to claim 19, wherein the at least one conductive path further comprises conductive material within the through hole.

21. The package according to claim 20, wherein the at least one conductive path electrically couples to an external terminal of the package.

22. The package according to claim 21, wherein the external terminal is a ground terminal.

23. The package according to claim 20, wherein the at least one conductive path comprises at least one of copper (Cu), gold (Au), silver (Ag), aluminum (Al), nickel (Ni), and chrome (Cr).

24. The package according to claim 18, wherein the coating layers comprise a polyimide.

25. An integrated circuit package including a sealant surrounding an integrated circuit, the package comprising:
 a conductive element mixed into the sealant to make the sealant conductive;
 one or more conductive paths electrically coupling the sealant to one or more external terminals of the package, each of the conductive paths comprising:
  a single via penetrating a circuit substrate of the package;
  a ball pad disposed on the single via; and
  an under-bump metallization (UBM) disposed between the ball pad and the external terminal; and
 a plurality of electrically non-conductive elements, each of the electrically non-conductive elements insulating electrical connections and conductive elements of the integrated circuit from the sealant.

26. The package according to claim 25, wherein the the integrated circuit is mounted upon a first surface of the circuit substrate, each of the conductive paths electrically coupling the first surface and a second surface of the circuit substrate.

27. The package according to claim 25, wherein the external terminals are ground terminals of the package.

28. The package according to claim 25, wherein the conductive elements of the integrated circuit comprise pads.

29. The package according to claim 28, wherein the electrical connections comprise wire elements electrically coupled to the pads, the electrically non-conductive material being interposed between each of the wire elements and the conductive sealant.

30. The package according to claim 25, wherein the conductive element comprises at least one of copper (Cu), gold (Au), silver (Ag), aluminum (Al), nickel (Ni), and chrome (Cr).

31. A method of forming an integrated circuit package comprising:
 enclosing an integrated circuit within an electrically conductive sealant such that the electrically conductive sealant contacts surfaces of the integrated circuit; and
 electrically isolating individual connection paths of the integrated circuit from the sealant.

32. The method according to claim 31, further comprising electrically coupling the sealant relative to an external terminal of the package.

33. The method according to claim 32, wherein the external terminal is a ground terminal.

34. The method according to claim 32, wherein electrically isolating comprises application of a polyimide prior to enclosing the integrated circuit.

35. The method according to claim 31, wherein electrically isolating includes applying electrically non-conductive material to pads of the integrated circuit.

36. The method according to claim 35, wherein electrically isolating further includes applying the electrically non-conductive material to wires coupled to the pads of the integrated circuit.

37. The method according to claim 35, wherein the electrically non-conductive material comprises a polyimide.

38. The method according to claim 31, wherein enclosing an integrated circuit comprises enclosing the integrated circuit in an epoxy intermixed with an electrically conductive material.

39. The method according to claim 38, wherein the electrically conductive material comprises at least one of one of copper (Cu), gold (Au), silver (Ag), aluminum (Al), nickel (Ni), and chrome (Cr).

* * * * *